US007015413B2

(12) United States Patent
Petrin et al.

(10) Patent No.: US 7,015,413 B2
(45) Date of Patent: Mar. 21, 2006

(54) PLASMA GENERATION SYSTEM HAVING A REFRACTOR

(75) Inventors: Andrei Petrin, Yongin (KR); Ji-hyun Hur, Seongnam (KR); Jai-kwang Shin, Anyang (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 10/755,474

(22) Filed: Jan. 13, 2004

(65) Prior Publication Data

US 2004/0140778 A1    Jul. 22, 2004

(30) Foreign Application Priority Data

Jan. 15, 2003    (KR) ................ 10-2003-0002723

(51) Int. Cl.
*B23K 10/00*    (2006.01)

(52) U.S. Cl. .................. 219/121.36; 219/121.43; 219/121.41; 204/298.37; 156/345.36; 118/723 MW

(58) Field of Classification Search ........... 219/121.36, 219/121.52, 121.4, 121.43, 121.41; 118/723 MW; 156/345.36, 345.41; 204/298.37
See application file for complete search history.

(56) References Cited

U.S. PATENT DOCUMENTS

| 5,234,526 | A | | 8/1993 | Chen et al. ................. 156/345 |
| 5,445,324 | A | * | 8/1995 | Berry et al. .................. 239/99 |
| 5,534,069 | A | * | 7/1996 | Kuwabara et al. .......... 118/719 |
| 2002/0062789 | A1 | * | 5/2002 | Nguyen et al. ............. 118/715 |
| 2002/0113144 | A1 | * | 8/2002 | Huang et al. ............ 239/424.5 |
| 2003/0031806 | A1 | * | 2/2003 | Jinks .......................... 427/569 |

* cited by examiner

*Primary Examiner*—Mark Paschall
(74) *Attorney, Agent, or Firm*—Lee & Morse, P.C.

(57) ABSTRACT

A plasma generation system that is capable of generating uniform high-density plasma includes a microwave generator for generating microwaves, a refractor for altering a direction of propagation of the microwaves, and an electromagnetic unit for applying a magnetic field to plasma formed by the microwaves to generate electron cyclotron resonance (ECR).

20 Claims, 2 Drawing Sheets

PLASMA GENERATION SYSTEM HAVING A REFRACTOR

BACKGROUND OF THE INVENTION

1. Field of the Invention

The present invention relates to a plasma generation system. More particularly, the present invention relates to a plasma generation system that generates uniform high-density plasma.

2. Description of the Related Art

FIG. 1 schematically illustrates a structure of a conventional electron cyclotron resonance (ECR) plasma device.

Referring to FIG. 1, a shower plate 13 is installed in an upper portion inside a processing chamber 11. A gas for forming plasma is supplied into the processing chamber 11 over a substrate 10 via the shower plate 13. The substrate 10 is seated on a substrate holder 17. A radio frequency bias in a range of 100 kHz to 15 MHz is applied from a radio frequency power source 29 to the substrate holder 17 via a matching network 27.

An etching gas is supplied into the processing chamber 11 via a gas inlet 19. Electromagnetic waves having an ultra-high frequency in a range of 300 MHz to 1 GHz are generated in the radio frequency power source 29. The electromagnetic waves, which are controlled by a tuner 21, are introduced into the processing chamber 11 through a waveguide 23 and ionize the etching gas to create plasma. The electromagnetic waves are resonant in a predetermined mode by a quartz window 15 placed on an uppermost portion of the processing chamber 11.

For high-efficiency discharge, a solenoid coil 25 for generating a magnetic field is disposed around the processing chamber 11, and a coil current is controlled so that a magnetic field in a range of 0–360 Gauss is generated below the shower plate 10. Thus, ECR is generated, and high-density plasma having an electron density of $10^{11}$ electrons/$cm^3$ is formed. Accordingly, the etching gas supplied into the processing chamber 11 via the gas inlet 19 is ionized to generate high-density plasma using electromagnetic waves and a magnetic field, thereby etching the substrate 10. The matching network 27 connected to the substrate holder 17 properly controls the temperature of the substrate 10 during an etching process and exhausts processed gas after the etching process using a pump 28 connected to the processing chamber 11.

In the conventional ECR plasma device as shown in FIG. 1, however, an entrance of the processing chamber 11, in which the quartz window 15 is placed, is narrow. Thus, when plasma etching is performed on a large-sized substrate, etching is performed only in a narrow area of the substrate and an etching profile becomes non-uniform. In an effort to etch a large-sized substrate, a conventional waveguide has been formed in a horn shape. In such an arrangement, however, microwaves passing through the waveguide diverge. Resultantly, plasma cannot be formed uniformly when a substrate has a large diameter.

SUMMARY OF THE INVENTION

The present invention provides a plasma generation system that generates uniform high-density plasma to obtain a uniform etching profile for use in connection with a substrate having a large diameter.

According to an embodiment of the present invention, a plasma generation system includes a microwave generator for generating microwaves, a refractor for altering a direction of propagation of the microwaves, and an electromagnetic unit for applying a magnetic field to plasma formed by the microwaves to generate electron cyclotron resonance (ECR).

Preferably, the refractor is a dielectric lens. More preferably, the dielectric lens is formed of alumina.

The microwave generator may include a radio frequency power source for generating the microwaves, a waveguide, which is connected to the radio frequency power source, for guiding the propagation of the microwaves, and a polarizer, which is placed at an outlet of the waveguide, for polarizing the microwaves in a single direction.

The plasma generation system may further include a vacuum chamber connected to a lower portion of the refractor, the vacuum chamber including a substrate etched by plasma and a substrate holder on which the substrate is seated.

According to another embodiment of the present invention, a plasma generation system includes a microwave generator for generating microwaves, an antenna for forming an electric field component of the microwaves in a single direction uniformly, a refractor for transmitting the microwaves as plane waves having a wavefront parallel to a substrate by refracting the microwaves, and an electromagnetic unit for applying a magnetic field to plasma formed by the microwaves and for generating electron cyclotron resonance (ECR).

Preferably, the refractor is a dielectric lens. More preferably, the dielectric lens is formed of alumina.

Preferably, the antenna is a corrugated horn antenna having a width that gradually increases in a direction of propagation of the microwaves and having inner walls that are corrugated.

The microwave generator may include a radio frequency power source for generating the microwaves, a waveguide, which is connected to the radio frequency power source, for guiding the propagation of the microwaves, and a polarizer, which is placed at an outlet of the waveguide, for polarizing the microwaves in a single direction.

The plasma generation system may further include a vacuum chamber connected to a lower portion of the refractor, the vacuum chamber including a substrate etched by plasma and a substrate holder on which the substrate is seated.

The present invention provides a plasma generation system that generates uniform high-density plasma for processing a device using a substrate having a large diameter, such as a 300 mm LCD, by providing a dielectric lens and preferably, a corrugated horn antenna.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1:
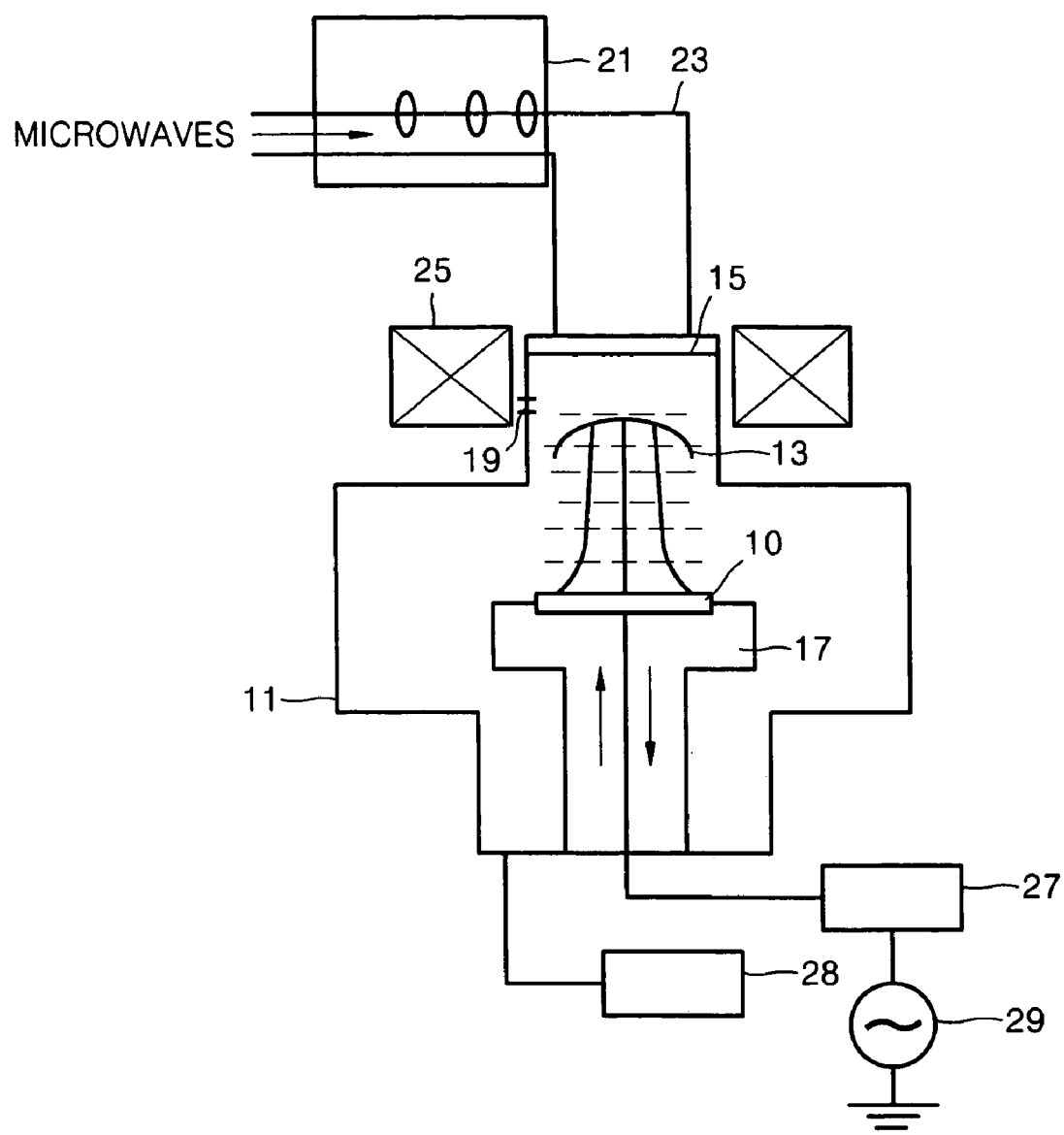
FIG. 1 schematically illustrates a structure of a conventional electron cyclotron resonance (ECR) plasma device.

Korean Patent Application No. 2003-2723, filed on Jan. 15, 2003, and entitled: "Plasma Generation System," is incorporated by reference herein in its entirety.

The present invention will now be described more fully hereinafter with reference to the accompanying drawings, in which a preferred embodiment of the invention is shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

Figure 2:
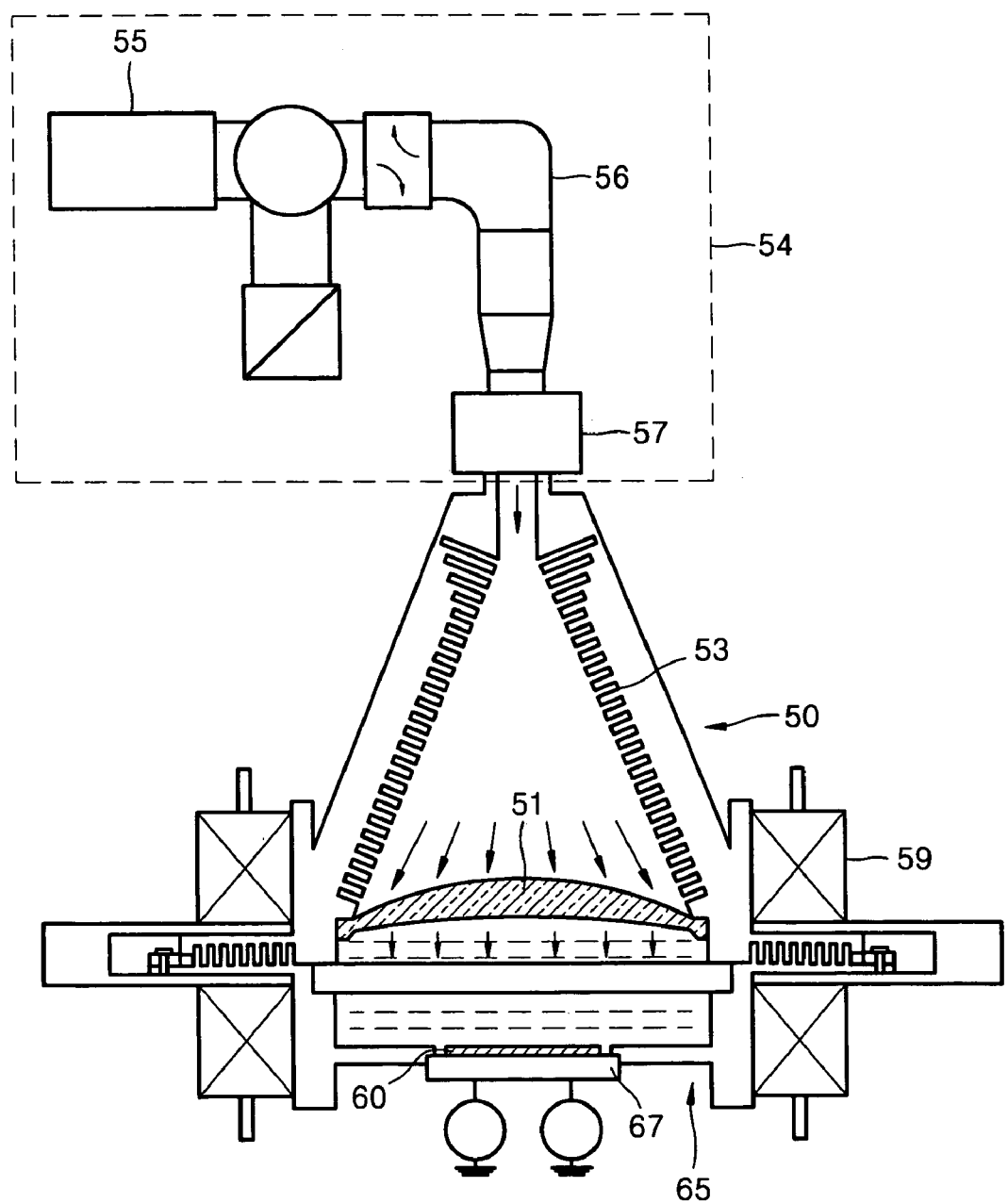
FIG. 2 schematically illustrates a structure of a plasma generation system according to an embodiment of the present invention.

FIG. 2 schematically illustrates a structure of a plasma generation system according to an embodiment of the present invention. Referring to FIG. 2, the plasma generation system according to the embodiment of the present invention includes a microwave generator 54, a microwave transformation chamber 50, and a vacuum chamber 65, in which plasma etching is performed.

The microwave generator 54 includes a radio frequency power source 55 for generating microwaves having an ultra-high frequency in a range of 300 MHz to 1 GHz, a waveguide 56, through which the microwaves propagate, and a polarizer 57, which is connected to an outlet of the waveguide 56, for polarizing the microwaves in a single direction.

The microwave transformation chamber 50 is formed in a horn shape having a width that gradually increases in a direction of microwave propagation to enable performance of plasma etching on a substrate having a large diameter.

The microwave transformation chamber 50 enables microwaves to spread out due to the horn shape thereof. A refractor 51, such as a dielectric lens, is provided between the microwave transformation chamber 50 and the vacuum chamber 65. The dielectric lens 51 changes the direction of propagation of microwaves and forms microwaves as plane waves having a wavefront parallel to the surface of a substrate 60. Thus, the wavefront of microwaves passing through the dielectric lens 51 is parallel to the substrate 60. The dielectric lens 51 may be formed of an insulating material, such as alumina ($Al_2O_3$). A material and refractive index or curvature of the dielectric lens 51 may be chosen in consideration of a divergence angle with respect to wavelength and direction of propagation of incident microwaves. Alternately, another means for changing a direction of microwaves may be used, instead of the dielectric lens 51.

Preferably, an electric field component of microwaves is uniformly formed in a single direction in the microwave transformation chamber 50 by installing a corrugated horn antenna 53 at an upper portion of the microwave transformation chamber 50, above the dielectric lens 51, as shown in FIG. 2. Due to the characteristics of the corrugated horn antenna 53 having a width that gradually increases and in which a plurality of corrugations are formed on inner walls, the direction of propagation of microwaves is constant and the electric field is formed in a single direction, resulting in uniform electric field distribution. In addition, the density of generated plasma can be increased by strengthening a main lobe formed in the direction of propagation of microwave and by weakening a minor lobe formed on both sides of the main lobe.

The vacuum chamber 65 includes a substrate holder 67 inside the vacuum chamber 65 and the substrate 60, which is seated on the substrate holder 67. An electromagnetic unit for applying a magnetic field, such as an electromagnetic coil 59, is provided outside the vacuum chamber 65.

Electrons and positive ions of a plasma gas move in circles in predetermined opposite directions due to the magnetic field, and gaseous molecules, such as hydrogen, nitrogen, or argon, can be formed as high-density plasma using electron cyclotron resonance (ECR), which occurs when the frequency of the circular motion of electrons and positive ions caused by the magnetic field is the same as the frequency of the microwaves.

Referring to FIG. 2, microwaves introduced into the vacuum chamber 65 ionize a gas supplied into the vacuum chamber 65 to form plasma. In addition, the magnetic field applied by the electromagnetic coil 59 accelerates electrons in the plasma and forms high-density plasma by ECR. In the plasma generation system according to the present invention, microwaves propagate as plane waves having a wavefront parallel to the large-sized substrate 60 because of the dielectric lens 51, thereby achieving a uniform plasma density distribution. In addition, the electric field component of the microwaves is preferably aligned in a single direction by further providing the corrugated horn antenna 53, such that the electric field distribution is uniform and plasma having higher density than that formed by conventional ECR plasma devices can be generated. Here, plasma etching can be performed by further providing a device, such as a sputter gun, inside the vacuum chamber 65 when necessary.

As described above, in the plasma generation system according to the present invention, the propagation state of microwaves is transformed by providing a dielectric lens such that plasma generation density can be uniform to obtain a uniform etching profile on a substrate having a large diameter. In addition, the electric field component of the microwaves can be aligned in a single direction by further providing a corrugated horn antenna, and by increasing a main lobe and reducing a minor lobe of the electric field, thereby improving plasma generation efficiency.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma generation system, comprising:
   a microwave generator for generating microwaves;
   a refractor for altering a direction of propagation of the microwaves; and
   an electromagnetic unit for applying a magnetic field to plasma formed by the microwaves to generate electron cyclotron resonance (ECR).

2. The system as claimed in claim 1, wherein the refractor is a dielectric lens.

3. The system as claimed in claim 2, wherein the dielectric lens is formed of alumina.

4. The system as claimed in claim 1, wherein the microwave generator comprises:
   a radio frequency power source for generating the microwaves;
   a waveguide, which is connected to the radio frequency power source, for guiding the propagation of the microwaves; and
   a polarizer, which is placed at an outlet of the waveguide, for polarizing the microwaves in a single direction.

5. The system as claimed in claim 1, further comprising:
   a vacuum chamber connected to a lower portion of the refractor, the vacuum chamber including a substrate holder for holding a substrate to be etched.

6. The system as claimed in claim 1, wherein the refractor has a different thickness between a central portion and a peripheral portion.

7. The system as claimed in claim 6, wherein the refractor is thicker in the central portion than in the peripheral portion.

8. The system as claimed in claim 1, wherein the refractor has a central portion and a peripheral portion, a distance between the microwave generator and the central portion being different than a distance between the microwave generator and the peripheral portion.

9. The system as claimed in claim 8, wherein the central portion is closer to the microwave generator than the peripheral portion.

10. A plasma generation system for use with a substrate, comprising:
   a microwave generator for generating microwaves;
   an antenna for forming an electric field component of the microwaves having a non-planar wavefront;
   a refractor for receiving the microwaves having the non-planar wavefront and for transmitting the microwaves as plane waves having a wavefront parallel to the substrate by refracting the microwaves; and
   an electromagnetic unit for applying a magnetic field to plasma formed by the microwaves and for generating electron cyclotron resonance (ECR).

11. The system as claimed in claim 10, wherein the refractor is a dielectric lens.

12. The system as claimed in claim 11, wherein the dielectric lens is formed of alumina.

13. The system as claimed in claim 10, wherein the antenna is a horn antenna having a width that gradually increases in a direction of propagation of the microwaves.

14. The system as claimed in claim 10, wherein the microwave generator comprises:
   a radio frequency power source for generating the microwaves;
   a waveguide, which is connected to the radio frequency power source, for guiding the propagation of the microwaves; and
   a polarizer, which is placed at an outlet of the waveguide, for polarizing the microwaves in a single direction.

15. The system as claimed in claim 10, further comprising:
   a vacuum chamber connected to a lower portion of the refractor, the vacuum chamber including a substrate holder for holding a substrate to be etched.

16. The system as claimed in claim 10, wherein the refractor has a different thickness between a central portion and a peripheral portion.

17. The system as claimed in claim 16, wherein the refractor is thicker in the central portion than in the peripheral portion.

18. The system as claimed in claim 10, wherein the refractor has a central portion and a peripheral portion, a distance between the microwave generator and the central portions being different than a distance between the microwave generator and the peripheral portion.

19. The system as claimed in claim 18, wherein the central portion is close to the microwave generator than the peripheral portion.

20. The system as claimed in claim 13, wherein inner walls of the horn antenna are corrugated.

* * * * *